(12) United States Patent
Cui et al.

(10) Patent No.: US 7,207,021 B2
(45) Date of Patent: Apr. 17, 2007

(54) METHOD FOR ESTIMATING A FREQUENCY-BASED RAMPTIME LIMIT

(75) Inventors: Qian Cui, San Jose, CA (US); Chun Chan, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 163 days.

(21) Appl. No.: 11/036,822

(22) Filed: Jan. 14, 2005

(65) Prior Publication Data

US 2006/0190853 A1  Aug. 24, 2006

(51) Int. Cl.
*G06F 17/50* (2006.01)
(52) U.S. Cl. .................. 716/6; 703/14; 716/1
(58) Field of Classification Search .............. 716/1, 716/6, 12; 703/14
See application file for complete search history.

(56) References Cited

U.S. PATENT DOCUMENTS 5,754,812 A * 5/1998 Favor et al. ............... 712/216

* cited by examiner

*Primary Examiner*—Thuan Do
(74) *Attorney, Agent, or Firm*—Westman, Champlin & Kelly, P.A.

(57) ABSTRACT

A method is provided for selecting a frequency-based ramptime limit for a technology. The method includes creating a logic chain with cells from the technology and applying a sequence of signals to the logic chain. Each signal has a different ramptime relative to a clock period. At least one signal quality characteristic is measured along the logic chain for each of the signals. The frequency-based ramptime limit is selected based on a comparison of the measured signal quality characteristics measured to at least one predefined signal quality value.

20 Claims, 3 Drawing Sheets

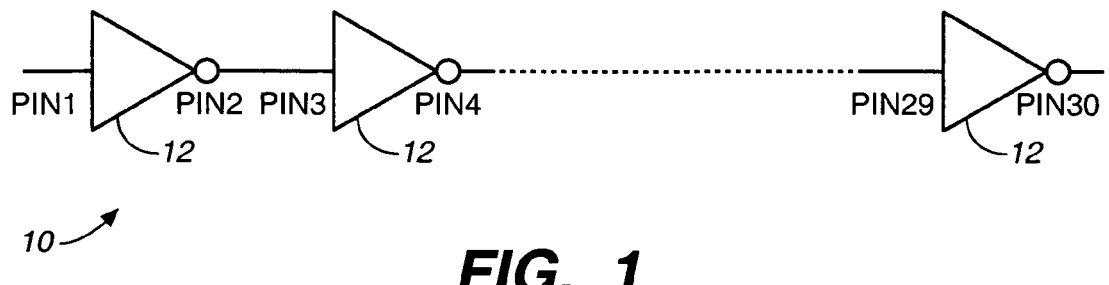
FIG._1
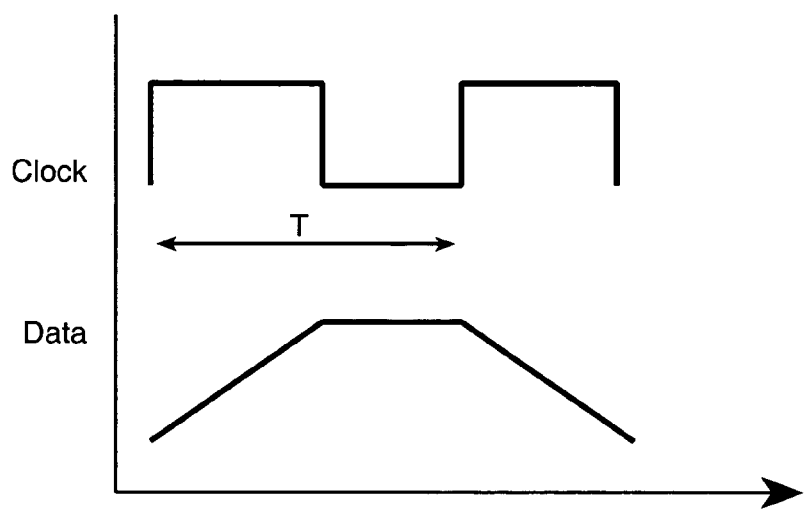
FIG._2
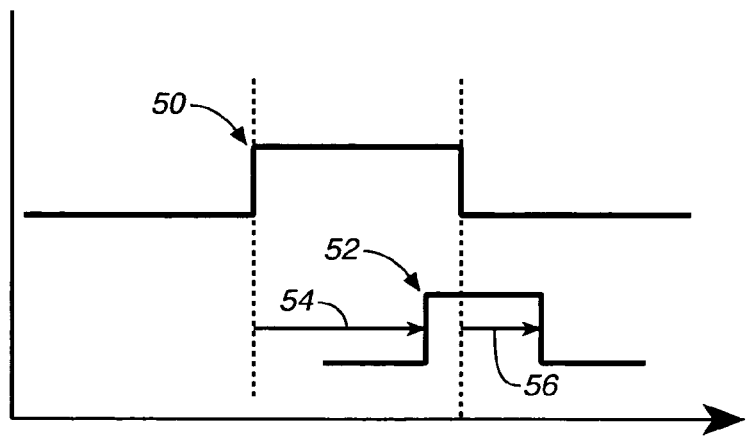
FIG._4

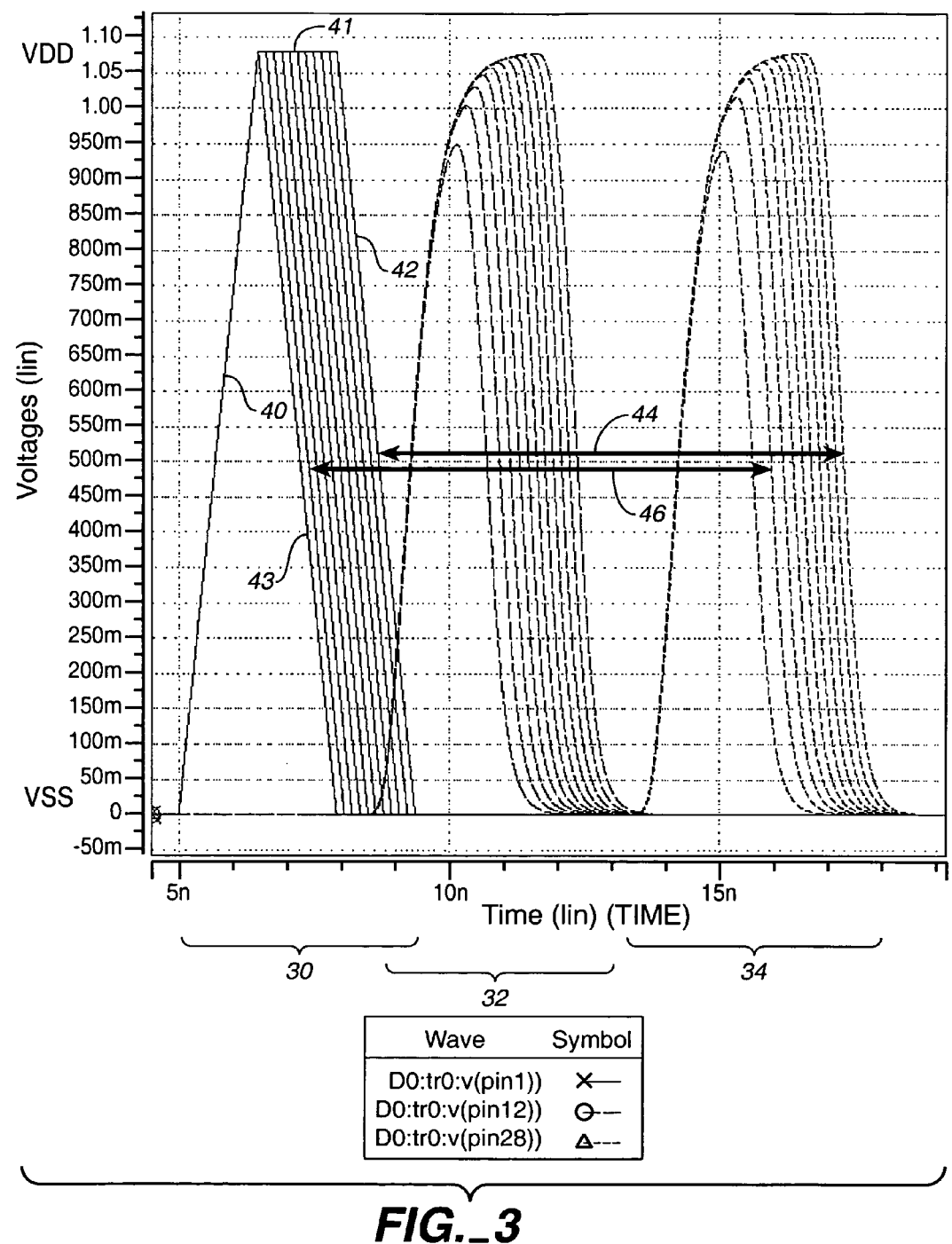
FIG._3

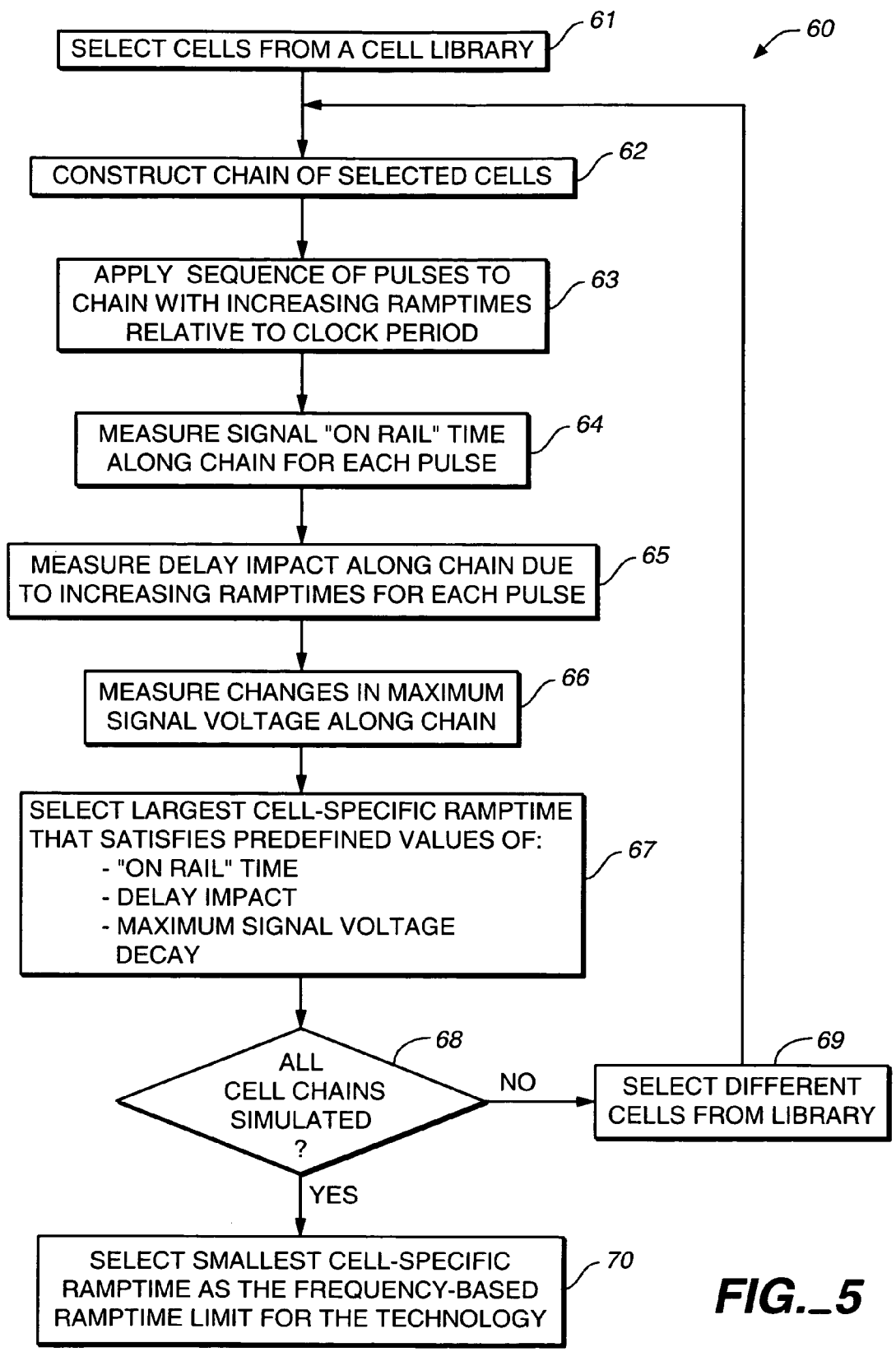
FIG._5

METHOD FOR ESTIMATING A FREQUENCY-BASED RAMPTIME LIMIT

CROSS-REFERENCE TO RELATED APPLICATION

None.

FIELD OF THE INVENTION

The present disclosure relates to electrical circuits and more specifically to a method of identifying a ramptime limit for signals in an electrical circuit, such as a semiconductor integrated circuit.

BACKGROUND OF THE INVENTION

The ramptime of an electrical signal is the time it takes for the signal to transition from one logic state to another logic state. For example a "rise time" is a time it takes for the signal to transition from a logic low level (such as a ground voltage, VSS) to a logic high level (such as a power supply voltage, VDD). A "fall time" is the time it takes for the signal to transition from the logic high level (such as VDD) to the logic low level (such as VSS). However instead of using the full-swing ramptimes defined above, to define ramptimes in terms of percentages of the full-swing voltage. For example, a 10%–90% ramptime (risetime) can be used to define the time required for a signal response to increase from 10% of VDD to 90% of VDD. A 30%–50% ramptime (risetime) is the time required for the signal response to increase from 30% of VDD to 50% of VDD.

In the design of advanced semiconductor integrated circuits, each semiconductor technology has a maximum ramptime limit for which all signals must meet in a design for that technology. If one or more signals generated within or by the integrated circuit design exceed the maximum ramptime limit, the design's performance will not meet its target performance or the design may fail to operate correctly.

The ramptimes of individual signals in a design impacts several design parameters. These parameters include signal quality and degradation. A signal transition preferably swings completely from one supply voltage level to the other supply voltage level. This swing can be reduced by an increase in ramptime. Ramptime also impacts Hot Carrier Induced (HCI) transistor degradation, which can affect circuit speeds and transistor lifetime. An increase in ramptime can increase power consumption of the integrated circuit, since a longer ramptime increases the short-circuit current that occurs when transistor devices switch states. An increase in ramptime can also lead to an increase to electromigration, which effects the lifetime of vias between metal layers on the integrated circuit. Increases ramptime can also increase crosstalk-induced noise and delay between the signals, which effects timing in the integrated circuit.

For these reasons, the ramptimes of signals generated within the integrated circuit should not exceed pre-defined technology ramptime limits. In addition to these pre-defined technology-based ramptime limits, there is a relative ramptime limit that is frequency-dependent. As the pulse width of a signal narrows with increasing frequency, the ramptime of the signal should also be reduced to ensure that the signal spends at least some time at the voltage supply rails.

Frequency-based ramptime limits have previously been set based on some criteria. For example, the ramptime for a clock signal on a clock net may be limited to a ramptime of ¼ or less of the clock cycle. A signal net may have a ramptime limit of ½ of the clock cycle. These ramptime limits are largely selected through intuitive thinking based on ideal waveforms and a desire for each signal to spend at least 50% of the time at a rail voltage level. However it may not be known whether such a ramptime limit is too conservative.

Cell libraries for semiconductor integrated circuit designs are usually characterized with an upper ramptime limit, which is usually larger than the technology-based ramptime limit, which is usually larger than the frequency-based ramptime limit. Thus, typical ramptime limits are fairly conservative.

Since fixing a ramptime violations tend to increase the chip size and the turn around time of the design process, it is not desirable to have a ramptime limit that is too conservative. Improved methods for setting ramptime limits are therefore desired.

SUMMARY OF THE INVENTION

An embodiment of the present invention is directed to a method for selecting a frequency-based ramptime limit for a technology. The method includes creating a logic chain with cells from the technology and applying a sequence of signals to the logic chain. Each signal has a different ramptime relative to a clock period. At least one signal quality characteristic is measured along the logic chain for each of the signals. The frequency-based ramptime limit is selected based on a comparison of the measured signal quality characteristics measured to at least one predefined signal quality value.

An embodiment of the present invention is also directed to a method of selecting a frequency-based ramptime limit for a semiconductor technology. The method includes creating a simulated logic chain with cells from a cell library for the technology and applying a simulated sequence of signals to the logic chain. Each signal has a different ramptime relative to a clock period. A plurality of different signal quality characteristics are measured along the logic chain for each of the signals. The frequency-based ramptime limit is selected as the largest of the ramptimes for which all of the plurality of measured signal quality characteristics for the corresponding signal satisfy respective predefined signal quality values.

BRIEF DESCRIPTION OF THE DRAWINGS

FIG. 1 is a diagram of a logic chain that can be used for simulating signal quality characteristics and thereby selecting a frequency-based ramptime limit, according to one embodiment of the present invention.

FIG. 2 is a waveform diagram illustrating a simulated clock signal and a data signal for application to the chain shown in FIG. 1 and which has an initial ramptime, according to one embodiment of the present invention.

FIG. 3 is a waveform diagram illustrating waveforms generated along the logic chain during simulation, according to one embodiment of the present invention.

FIG. 4 is a waveform diagram illustrating distortion due to rise/fall delay differences in chains of non-inverting logic cells.

FIG. 5 is a flow chart illustrating a method of selecting a frequency-based ramptime limit, according to one embodiment of the present invention.

DETAILED DESCRIPTION OF ILLUSTRATIVE EMBODIMENTS

An embodiment of the present invention derives a frequency-based ramptime limit for an advanced semiconductor technology by simulating a chain of cells in that technology. The chain is simulated with various ramptimes while one or more signal quality characteristics are observed or measured along the chain. Based on these observations or measurements, a suitable ramptime limit for that cell can be selected. This same process can be carried out for a plurality of cells in the technology. The most conservative (smallest) cell-specific ramptime limit can be chosen as a limit for the whole technology.

To perform the simulation, the output of each cell in the chain is connected to the input of the next cell in the chain through a simulated "wire". The output loading on each cell is adjusted by setting the characteristics of the wire, which can be expressed as a resistor-capacitor (RC) circuit for example. The output loads are selected such that the chain operates at a target frequency and that the signal applied to the input of the chain with a desired initial ramptime propagates through the chain with a stable ramptime anywhere in the chain that is the same as the input ramptime. Since at each stage, the cell and wire is identical, the ramptime is stable and the same anywhere in the chain.

A simulation tool such as HSPICE can be used to simulate the circuit. A series of simulations are carried out in which the pulse width of the input signal is varied. In one embodiment, the pulse width is gradually reduced with each pulse applied to the chain. The pulse width is reduced by increasing the frequency of a clock signal that generates the input pulses. Since the ramptime of the input signal remains constant, shortening the input pulse width effectively increases the ramptime relative to the clock period. This approach is easily implemented in an HSPICE simulation with a sweep statement. A frequency-based ramptime limit for the technology can then be derived or otherwise identified from the simulation results.

In one embodiment, the frequency-based ramptime limit is selected based on three signal quality criteria. The ramptime limit is selected as the maximum ramptime at which the signal propagating through the chain satisfies all three criteria. The criteria can include, for example, a requirement that the signal continues to reach the rail-to-rail voltage levels, the signal propagates stably, and the impact of the ramptime on propagation delay is less then a selected amount. However, any number of criteria can be used in alternative embodiments and other signal quality criteria can be used in replace of those mentioned above.

1. EXAMPLE

FIG. 1 is a diagram illustrating an example of a delay chain 10, which can be used to derive a frequency-based ramptime limit according to one embodiment of the present invention. In this embodiment, delay chain 10 includes a series of fifteen identical inverters 12, wherein the output pin of each inverter is coupled to the input pin of the next inverter in the chain. However any number of inverters can be used. For simulation purposes, each inverter pin is labeled with a unique name. The first inverter in chain 10 has an input pin PIN1 and an output pin PIN2. The second inverter in the chain has an input pin PIN3 and an output pin PIN4. The last inverter in the chain has an input pin PIN29 and an output pin PIN30.

Each inverter 12 is provided with the same output load as the other inverters in chain 10. For example, each "wire" connecting an output pin of one inverter with the input pin of the next inverter in the chain is expressed as a RC circuit, with the resistance and capacitance values of each wire being the same as the other wires in chain 10.

During the simulation, a clock signal is defined having an initial clock frequency. An input signal is created on input pin PIN1, which changes states at each rising edge of the clock signal. The resistance and capacitance values of each wire are adjusted so that the stable ramptime anywhere inside the chain has an initial value of roughly ½ of the initial clock cycle. This ramptime is also applied later on the input pin.

As shown in FIG. 2, this allows the input data signal to spend approximately 50% of the clock period, T, at one of the rail voltage levels for an ideal waveform. Thus, the full rail-to-rail ramptime of the data signal is ½ T and the "on rail" time is also ½ T.

The initial ramptime is conservative enough to propagate the signal along chain 10 without significant degradation. With each subsequent pulse of the input data signal, the HSPICE simulation gradually increases the ramptime from the initial ramptime value relative to the clock period while measuring various performance characteristics along the chain. From the measured signal characteristics, a maximum ramptime limit can be selected such that the signal characteristics do not degrade beyond predefined limits.

The HSPICE simulation can directly increase the ramptime by adjusting the output loads, but this can be difficult to do within a HSPICE simulation, and the results can be hard to quantify. Rather in one embodiment of the present invention, the HSPICE simulation tool progressively reduces the pulse width of the input data signal by increasing the clock frequency (and thereby reducing the clock period T). As mentioned above, this is equivalent to increasing the ramptime with the frequency unchanged. This approach is easily implemented in an HSPICE simulation with a sweep statement.

In one embodiment, the input pulse width is progressively decreased by 1/10 for ten times so that the "on rail" time for the input signal progressively decreases and the ramptime relative to the clock period progressively increases from 1/2T to 1/1.9T, 1/1.8T, 1/1.7T, 1/1.6T, 1/1.5T, 1/1.4T, 1/1.3T, 1/1.2T, 1/1.1T and 1T.

FIG. 3 is a graph illustrating the HSPICE simulation waveforms. The waveforms for each input pulse are superimposed on one another. A first group of waveforms 30 represent the eleven input pulses applied to input pin PIN1 of chain 10. A second group of waveforms 32 represents the resulting waveforms generated on the output pin PIN12 of the sixth inverter in the chain, which is located at approximately the middle of the chain. A third group of waveforms 34 represents the resulting signals on the output pin PIN28 of the second to last inverter of chain 10.

Each waveform is plotted in volts as a function of time. At the first rising edge of the clock signal, the input data signal begins to ramp from a ground supply voltage VSS (e.g., zero volts) along waveform segment 40 to a power supply voltage VDD (e.g., 1.078 volts) and then remains at VDD along waveform segment 41 until the next rising edge of the clock signal. At the next rising edge of the clock signal, the input data signal begins to transitions back to VSS, along segment 42.

With each subsequent input pulse, the time spent at VDD (waveform segment 41) is progressively reduced by 1/10 of the clock period T. For the initial input pulse (the outer waveform in group 30), the input ramp time is 1/2T. As the input pulse width is gradually reduced with each subsequent pulse, the input ramptimes are effectively increased relative to the decreasing clock period T. Waveform 43 represents the last input pulse of the sequence in which the input ramptime is 1T.

Three signal integrity characteristics are measured through HSPICE measurement statements. Table 1 shows the results of the measurement statements.

TABLE 1

| Input Ramp | 1/2T | 1/1.9T | 1/1.8T | 1/1.7T | 1/1.6T | 1/1.5T | 1/1.4T | 1/1.3T | 1/1.2T | 1/1.1T | 1T |
|---|---|---|---|---|---|---|---|---|---|---|---|
| 99% On Rail | 26% | 21% | 15% | 10% | Fail | Fail | Fail | Fail | Fail | Fail | Fail |
| Delay | 8.618 | 8.614 | 8.61 | 8.602 | 8.592 | 8.575 | 8.549 | 8.506 | 8.427 | 8.238 | Fail |
| % Delay | 100.0% | 100.0% | 99.90% | 99.80% | 99.70% | 99.50% | 99.20% | 98.70% | 97.80% | 95.60% | Fail |
| V PIN12 | 1.078 | 1.077 | 1.075 | 1.073 | 1.07 | 1.065 | 1.058 | 1.047 | 1.031 | 1.004 | 0.949 |
| V PIN28 | 1.0786 | 1.0775 | 1.0758 | 1.0734 | 1.0699 | 1.0646 | 1.0562 | 1.0424 | 1.0161 | 0.9412 | 0 |
| % V | 100.0% | 100.0% | 100.0% | 100.0% | 100.0% | 99.90% | 99.80% | 99.50% | 98.50% | 93.70% | 0.00% |

First, a pin is selected near the end of chain 10, such as PIN28, and the time during which the signal on that pin remains at VDD is measured. In one embodiment, the measurement represents how long the signal stays above 99% VDD (e.g. 99% 1.078 volts). This number is placed in the second row of Table 1 as a percentage of the clock period T. From the Table, we can see that once the input signal ramptime reaches 1/1.6T, the signal on PIN28 can no longer reach 99% VDD. This measurement can be used as one criterion for selecting a frequency-based ramptime limit. In an alternative embodiment, the HSPICE simulation tool simply measures the maximum voltage reached on PIN28 (or any other pin in the chain) and determines the largest ramptime at which the voltage still reaches 99% VDD. Other percentages of the rail voltage can also be used.

The second measurement statement of the HSPICE simulation measures the signal propagation delay from PIN1 to PIN28. In this example, the propagation delay is measured on the high-to-low transition at the time the signal reaches 50% VDD. Arrow 44 illustrates the propagation delay for the initial pulse. Arrow 46 represents the propagation delay for the last pulse in the sequence. These measurements are placed in the third row of Table 1 for each input ramptime. As shown in FIG. 3, the propagation delay decreases with increasing ramptime. Next, the measured delay for each input ramptime is compared to the measured delay for the initial ramptime. This comparison is expressed in terms of a percentage number, for example, which is placed in row four of Table 1.

The percentages in row four represent a "delay impact" of the increasing ramptime. With a large ramptime, the input signal begins to switch so fast that the signal begins to switch back to VSS at a time at which the circuit is not fully stable at VDD. For this calculation we assume that the input signal switches states at each rising edge of the clock signal such that there is 100% switch activity.

This delay impact is typically not a serious problem in an integrated circuit since ramptime violations only occur at worst case conditions, and fast timing in worst case conditions typically do not cause any addition problems in the circuit. However, this delay impact can be used as a further criterion for selecting a suitable frequency-based ramptime limit.

In one embodiment, the ramptime limit can be selected based on a fixed percentage delay impact, such as a maximum impact of 0.2%. Other percentages can also be used. With a maximum delay impact of 0.2%, the maximum ramptime limit can be selected as the largest ramptime that does not cause a delay impact of greater than 0.2%. Any ramptime causing a percentage delay impact than 0.2% would cause a ramptime violation. With the results shown in Table 1, a 0.2% delay impact is not exceeded until the input ramptime is 1/1.6T.

A third measurement statement in the HSPICE simulation can be used to measure stability of the signal as it propagates through chain 10. With this measurement, we do not care whether the signal can reach the supply rail (e.g., VDD) but whether the maximum signal voltage degrades as the signal propagates along the chain.

In one embodiment, the third measurement statement measures the maximum signal voltage at some point in the middle of the chain (or at any other point in the chain) and at a point near the end of the chain (or at any other different point in the chain). Row five in Table 1 represents the maximum signal voltage for each ramptime at PIN12 in the chain. Row six represents the measured maximum voltage reached for each ramptime at PIN28. From the measured data in rows five and six, the percentage difference of the value on PIN12 and the value on PIN28 is calculated and placed in row 7. Alternatively, the difference in voltage can be calculated. From the percentages in row 7, we can see that even if the signal cannot reach 99% VDD, it can still propagate through chain 10 without decaying. For example, with a ramptime of 1.16T, the signal can still propagate through the chain with substantially no decay in maximum voltage from one inverter to the next. This measurement can be used as another criterion for a maximum frequency-based limit. Any percentage decay or decay amount can be used as a threshold for selecting a suitable ramptime limit.

Using these three signal integrity criteria, a maximum frequency-based ramptime limit can be selected such that all three criteria are satisfied. As the input ramptime is progressively increased, if the current ramptime causes the measured signal characteristics to fail at least one of the three criteria, the preceding ramptime value can be selected as the maximum ramptime limit. In the example shown in Table 1, a ramptime of 1/1.6T satisfies all three criteria. However, any ramptime value less than 1/1.6T can be selected, and lower values can be selected for more conservative limits.

The above-described method selecting a frequency-based ramptime limit can be preformed for a single cell in a technology library or can be performed for multiple cells in a library, such as inverters, NAND gates, NOR gates, OR gates, AND gates and BUFFER gates with different drive strengths. A similar circuit can be constructed for each cell, and the same HSPICE simulation experiment can be performed to get the maximum ramptime limit for that cell based on the three criteria stated above. In one embodiment, the most conservative (smallest) ramptime limit of the simulated cells is selected as the ramptime limit for the whole technology. However, other criteria can also be used for selecting a global limit for the technology.

When cell chains are constructed with non-inverting cells like OR, AND or BUFFER gates, problems can arise when performing the HSPICE simulations. The rise delays and the fall delays for these cells usually differ significantly from one another. With a non-inverting chain, a rise transition will always remain a rise transition in because the cell logic is positive. This makes the input pulse width shrink due to the rise/fall delay difference. The waveform becomes distorted along the chain, which corrupts the HSPICE measurements.

FIG. 4 is a diagram, which illustrates an input signal pulse 50 and a corresponding pulse 52 further down a positive logic cell chain. Arrow 54 represents the cumulative rise time delay through the chain, and arrow 56 represents the cumulative fall time delay through the chain. The difference between delays 54 and 56 cause the width of pulse 52 to shrink. The waveform distortion problem in positive logic cells can be removed by inserting inverters at various stages in the circuit, such as at every other stage of the circuit. For example, the rise/fall signal can be inverted every time it passes a positive logic stage such that the waveform distortion problem can be avoided. The HSPICE simulation can therefore focus on the criteria mentioned above.

FIG. 5 is a flowchart illustrating a method 60 of selecting a frequency-based ramptime limit for a particular semiconductor technology according to one embodiment of the present invention. At step 60, cells, such as inverters, are selected from a cell library. At step 62, a cell chain is constructed with the selected cells similar to the chain shown in FIG. 1. At step 63, a simulation toll applies a sequence of pulses to the chain with decreasing pulse widths. However, the pulse widths can be increased, decreased or otherwise varied in any order with each pulse or with every selected number of pulses in alternative embodiments.

At step 64, the simulation tool measures the "On Rail" time along the chain for each pulse. At step 65, the delay impact due to the varying ramptimes is measured. At step 66, the maximum signal voltage is measured along the chain, for each pulse. At step 67, the largest cell-specific ramptime that satisfies predefined values of "On Rail" time, delay impact and maximum signal voltage decay.

If, at step 68, there are more cell chains to be simulated, different cells are all selected from the cell library, and the process returns to step 62 to construct another chain with the newly selected cells. Once all chains have been simulated, The smallest cell-specific ramptime limit is selected as the frequency-based ramptime limit for the technology.

The order of steps in FIG. 5 can be altered in alternative embodiments of the present invention.

The above-examples represent the absolute worse case since the input signal causes 100% switching activity and the timing path has identical stages. Therefore, if the ramptime is critical at one stage, it will be critical at all other stages in the timing path. In a real integrated circuit design, the ramptime is typically critical at only one stage of a timing path. Since the above-example causes the ramptime to be critical at all stages in the timing path, the example is conservative enough to obtain a good upper limit for the ramptime.

Although the present invention has been described with reference to preferred embodiments, workers skilled in the art will recognize that changes may be made in form and detail without departing from the spirit and scope of the invention.

What is claimed is:

1. A method of selecting a frequency-based ramptime limit for a technology, the method comprising:
   (a) creating a logic chain with cells from the technology;
   (b) applying a sequence of signals to the logic chain, each signal having a different ramptime relative to a clock period;
   (c) measuring at least one signal quality characteristic along the logic chain for each of the signals; and
   (d) selecting the frequency-based ramptime limit based on a comparison of the quality characteristics measured in (c) to at least one predefined signal quality value.

2. The method of claim 1 wherein step (a) comprises creating a logic chain design with a computer-based design tool, and steps (b) and (c) are performed with a simulation tool applied to the logic chain design.

3. The method of claim 1 wherein step (a) further comprises creating the logic chain with a sequence of identical cells from the technology.

4. The method of claim 3 and further comprising:
   (e) performing steps (a) through (d) for each of a plurality of different logic cells from the technology to produce respective cell-specific ramptime limits for the plurality of different logic cells; and
   (f) selecting a global, frequency-based ramptime limit based on the cell-specific ramptime limits.

5. The method of claim 1 wherein the cells comprise non-inverting logic cells and step (a) further comprises inserting inverters at various locations along the logic chain, between adjacent non-inverting logic cells in the logic chain.

6. The method of claim 1 wherein step (a) comprises defining an output load on each cell in the logic chain and the clock period such that at least one of the ramptimes in the sequence of signals is stable anywhere in the logic chain and corresponds to a predefined ramptime value.

7. The method of claim 1 wherein step (b) comprises applying a sequence of pulses to the logic chain, each pulse having a different pulse width such that the ramptime on each pulse is a different percentage of the clock period for that pulse.

8. The method of claim 1 wherein step (b) comprises creating a clock signal having the clock period and generating an input signal which changes states on one edge of each clock period of the clock signal to thereby generate a sequence of pulses representing the sequence of signals.

9. The method of claim 1 wherein:
   step (c) comprises, for each signal in the sequence, measuring a voltage of the signal at a node along the chain; and
   step (d) comprises selecting the frequency-based ramptime limit based on whether, for each signal, the voltage reaches a predetermined voltage relative to a voltage supply rail for the logic chain.

10. The method of claim 9 wherein:
step (c) comprises, for each signal in the sequence, measuring an "on rail" time during which the voltage of the signal reaches at least the predetermined voltage; and
step (d) comprises selecting the frequency-based ramptime limit based on a comparison of the "on rail" times measured in (c) to a predetermined minimum "on rail" time.

11. The method of claim 1 wherein:
step (c) comprises, for each signal in the sequence, measuring an impact on progagation delay of the signal along the logic chain due to the respective ramptime; and
step (d) comprises selecting the frequency-based ramptime limit based on a comparison of the impacts on propagation delay measured in (c) to a predetermined maximum impact.

12. The method of claim 1 wherein:
step (c) comprises, for each signal in the sequence, measuring a maximum voltage reached by the signal at a first location and a second, downstream location along the logic chain, and measuring a difference between the maximum voltages at the first and second locations; and
step (d) comprises selecting the frequency-based ramptime limit based on a comparison of the differences measured in (c) to a predetermined maximum difference.

13. The method of claim 1 wherein:
step (c) comprises measuring a plurality of different signal quality characteristics along the logic chain for each of the signals; and
step (d) comprises selecting the frequency-based ramptime limit as the largest of the ramptimes for which all of the plurality of measured signal quality characteristics for the corresponding signal satisfy respective predefined signal quality values.

14. A method of selecting a frequency-based ramptime limit for a technology, the method comprising:
(a) creating a logic chain with cells from the technology;
(b) applying a sequence of signals to the logic chain, each signal having a different ramptime relative to a clock period;
(c) measuring at least one signal quality characteristic along the logic chain for each of the signals;
(d) selecting the frequency-based ramptime limit based on a comparison of the quality characteristics measured in (c) to at least one predefined signal quality value;
(e) performing steps (a) through (d) for each of a plurality of different logic cells from the technology to produce respective cell-specific ramptime limits for the plurality of different logic cells; and
(f) selecting a global, frequency-based ramptime limit based on the cell-specific ramptime limits.

15. A method of selecting a frequency-based ramptime limit for a semiconductor technology, the method comprising:
(a) creating a simulated logic chain with cells from a cell library for the technology;
(b) applying a simulated sequence of signals to the logic chain, each signal having a different ramptime relative to a clock period;
(c) measuring a plurality of different signal quality characteristics along the logic chain for each of the signals; and
(d) selecting the frequency-based ramptime limit as the largest of the ramptimes for which all of the plurality of measured signal quality characteristics for the corresponding signal satisfy respective predefined signal quality values.

16. The method of claim 15 wherein step (a) comprises defining an output load on each cell in the logic chain and the clock period such that at least one of the ramptimes in the sequence of signals is stable anywhere in the logic chain and corresponds to a predefined ramptime value.

17. The method of claim 15 wherein step (b) comprises applying a sequence of pulses to the logic chain, each pulse having a different pulse width such that the ramptime on each pulse is a different percentage of the clock period for that pulse.

18. The method of claim 15 wherein:
step (c) comprises, for each signal in the sequence, measuring an "on rail" time during which the signal has a voltage of at least a predetermined voltage relative to a voltage supply rail for the logic chain, wherein the "on rail" time is measured at a node along the chain; and
step (d) comprises selecting the frequency-based ramptime limit based on a comparison of the "on rail" times measured in (c) to a predetermined minimum "on rail" time.

19. The method of claim 15 wherein:
step (c) comprises, for each signal in the sequence, measuring an impact on progagation delay of the signal along the logic chain due to the respective ramptime; and
step (d) comprises selecting the frequency-based ramptime limit based on a comparison of the impacts on propagation delay measured in (c) to a predetermined maximum impact.

20. The method of claim 15 wherein:
step (c) comprises, for each signal in the sequence, measuring a maximum voltage reached by the signal at a first location and a second, downstream location along the logic chain, and measuring a difference between the maximum voltages at the first and second locations; and
step (d) comprises selecting the frequency-based ramptime limit based on a comparison of the differences measured in (c) to a predetermined maximum difference.

* * * * *